United States Patent
Bird et al.

(10) Patent No.: US 9,692,413 B2
(45) Date of Patent: Jun. 27, 2017

(54) CONFIGURABLE EXCLUSIVE-OR / EXCLUSIVE-NOR GATE USING MAGNETO-ELECTRIC TUNNEL JUNCTIONS

(71) Applicants: The Research Foundation for the State University of New York, Amherst, NY (US); The Board of Regents of The University of Texas System, Austin, TX (US)

(72) Inventors: Jonathan P. Bird, Buffalo, NY (US); Andrew Marshall, Dallas, TX (US)

(73) Assignees: The Research Foundation for the State University of New York, Amherst, NY (US); Board of Regents, the University of Texas System, Austin, TX (US)

( * ) Notice: Subject to any disclaimer, the term of this patent is extended or adjusted under 35 U.S.C. 154(b) by 0 days.

(21) Appl. No.: 15/337,962

(22) Filed: Oct. 28, 2016

(65) Prior Publication Data

US 2017/0093398 A1 Mar. 30, 2017

Related U.S. Application Data

(63) Continuation-in-part of application No. 14/871,199, filed on Sep. 30, 2015, now Pat. No. 9,503,085.

(51) Int. Cl.
*H03K 19/21* (2006.01)
*H03K 19/00* (2006.01)
(Continued)

(52) U.S. Cl.
CPC ......... *H03K 19/0008* (2013.01); *H01L 43/08* (2013.01); *H03K 19/18* (2013.01); *H03K 19/21* (2013.01)

(58) Field of Classification Search
CPC ....... H01L 43/08; H01L 29/82; H01L 39/025; H01L 39/045; H01L 39/22; H01L 39/223;
(Continued)

(56) References Cited

U.S. PATENT DOCUMENTS 7,187,576 B2 3/2007 Braun et al.
7,439,770 B2 10/2008 Kim et al.
(Continued)

OTHER PUBLICATIONS

Niikonov, Dmitri E. et al., "Overview of Beyond-CMOS Devices and a Uniform Methodology for Their Benchmarking," Proceedings of the IEEE, vol. 101, No. 12, Dec. 2013, IEEE, pp. 2498-2533.
(Continued)

*Primary Examiner* — Vibol Tan
(74) *Attorney, Agent, or Firm* — Withrow & Terranova, P.L.L.C.

(57) ABSTRACT

A configurable ME MTJ XOR/XNOR gate includes an insulator separating a top and bottom FM layer, a top ME layer with a first boundary magnetism at an interface of the top ME layer and the top FM layer, a bottom ME layer with a second boundary magnetism at an interface of the bottom ME layer and the bottom FM layer, and a top electrode coupled to the top ME layer and a bottom electrode coupled to the bottom ME layer. A voltage between the top electrode and FM layer is a first input, a voltage between the bottom electrode and FM layer is a second input, and a resistance between the top and bottom FM layer is indicative of the XOR or the XNOR of the inputs. The configurable ME MTJ XOR/XNOR gate has reduced energy consumption, smaller area, faster switching times, is non-volatile, and is configurable.

20 Claims, 10 Drawing Sheets (51) Int. Cl.
*H01L 43/08* (2006.01)
*H03K 19/18* (2006.01)

(58) Field of Classification Search
CPC ... H01L 39/2493; H01L 29/437; H01L 39/16; H01L 39/2403; G11C 19/0808; G11C 5/08; H03K 19/21; H03K 19/23; H03K 19/20; H03K 19/195; H03K 17/92; H03K 23/763; B82Y 10/00; B82Y 25/00; B82Y 40/00; Y10S 977/935; Y10S 505/817; Y10S 505/832; Y10S 505/864; Y10S 505/865; Y10S 505/00; Y10S 505/706; G06F 7/501; G06F 7/5443; G06F 7/381; G11B 5/3909; H03D 2200/0039; Y10T 29/49014; Y10T 74/2119
See application file for complete search history.

(56) References Cited

U.S. PATENT DOCUMENTS

| | | | |
|---|---|---|---|
| 8,213,606 | B2 | 7/2012 | Shantz et al. |
| 8,344,758 | B2 | 1/2013 | Javerliac et al. |
| 8,374,020 | B2 | 2/2013 | Katti |
| 8,400,066 | B1 | 3/2013 | Pileggi et al. |
| 8,450,818 | B2 | 5/2013 | Nikonov et al. |
| 8,471,598 | B2 | 6/2013 | Yu et al. |
| 8,503,222 | B2 * | 8/2013 | Suzuki ............... G11C 11/16 365/158 |
| 8,885,395 | B2 | 11/2014 | Zhou et al. |
| 8,891,291 | B2 | 11/2014 | Zhou et al. |
| 9,172,030 | B2 | 10/2015 | Wang et al. |
| 9,224,447 | B2 | 12/2015 | Wang et al. |
| 9,276,040 | B1 | 3/2016 | Marshall et al. |
| 9,503,085 | B1 | 11/2016 | Bird et al. |
| 2009/0067224 | A1 * | 3/2009 | Hochstrat ............ G11C 11/16 365/158 |
| 2012/0314489 | A1 | 12/2012 | Lilja et al. |
| 2015/0243414 | A1 * | 8/2015 | Binek ................ C01G 37/027 252/62.51 C |
| 2016/0225890 | A1 * | 8/2016 | Datta ................... H01L 43/08 |

OTHER PUBLICATIONS

Binek, Christian et al., "Magnetoelectronics with magnetoelectrics," Journal of Physics: Condensed Matter, vol. 17, 2005, Institute of Physics Publishing, pp. L39-L44.

Non-Final Office Action for U.S. Appl. No. 14/871,199, mailed Mar. 24, 2016, 5 pages.

Notice of Allowance for U.S. Appl. No. 14/871,199, mailed Jul. 15, 2016, 7 pages.

* cited by examiner

CONFIGURABLE EXCLUSIVE-OR / EXCLUSIVE-NOR GATE USING MAGNETO-ELECTRIC TUNNEL JUNCTIONS

RELATED APPLICATIONS

This application is a continuation-in-part of U.S. patent application Ser. No. 14/871,199, filed Sep. 30, 2015, the disclosure of which is hereby incorporated herein by reference in its entirety.

GOVERNMENT FUNDING

This invention was made with government funds under Agreement No. 70NANB12H107 awarded by NIST. The U.S. Government has rights in this invention.

FIELD OF THE DISCLOSURE

The present disclosure relates to the use of Magnetic Tunnel Junction (MTJ) devices.

BACKGROUND

A Magnetic Tunnel Junction (MTJ) includes two ferromagnets (FMs) separated by a thin insulator. If the insulating layer is thin enough, electrons can tunnel from one FM into the other. Each of the FMs has a direction of magnetization. When the directions of magnetization are aligned, or parallel, then the electrons flow more freely across the barrier from one FM to the other. When the directions of magnetization are oppositely aligned, or antiparallel, then the electron flow is more restricted. The direction of the two magnetizations can be switched by an external magnetic field. Using this phenomenon, an MTJ can be switched between two states of tunneling resistance, one with relatively low resistance and one with relatively high resistance.

Typically, the magnetization of one of the ferromagnetic layers is held fixed by forming a layer of antiferromagnetic material next to that FM. This is sometimes referred to as "pinning" the FM. Additionally, an external magnetic field can be generated by an electrical current flowing through a conductor. This requires a significant amount of power and creates waste heat.

Complementary Metal-Oxide Semiconductor (CMOS) based technologies have been made increasingly smaller. As continued miniaturization may be difficult, various "beyond-CMOS" technologies are being considered. Magneto-electrics (MEs) are rapidly emerging as a key technology for applications in various beyond-CMOS spin-based device technologies. An ME can create a magnetic field using an applied voltage instead of a flowing electrical current. An ME MTJ is a device based on MEs that shows great promise for future memory and logic applications. In an ME MTJ, switching is achieved by reversing the magnetization of the so-called "free" FM of an MTJ. Specifically, the magnetization reversal is induced by means of the voltage-control of magnetism of a proximal ME layer. Voltage control minimizes power consumption by making use of exchange biasing between the antiferromagnetic (AFM) ME layer and the free FM. This makes the ME MTJ an extremely low power device which can typically operate with a supply of +/− 0.1-0.2 V. Boundary magnetization at the ME layer interface has the inherent property of non-volatility. This makes ME MTJ attractive for memory applications and perhaps logic applications. So far, the use of an ME MTJ for logic applications has been limited.

Accordingly, logic applications for ME MTJs are needed for reducing energy consumption and providing non-volatility.

SUMMARY

A configurable magneto-electric (ME) magnetic tunnel junction (MTJ) Exclusive-OR (XOR)/Exclusive-NOR (XNOR) is provided. The configurable ME MTJ XOR/XNOR gate includes an insulator separating a top ferromagnetic (FM) layer and a bottom FM layer, a top ME layer on the top FM layer with a first boundary magnetism at an interface of the top ME layer and the top FM layer, a bottom ME layer on the bottom FM layer with a second boundary magnetism at an interface of the bottom ME layer and the bottom FM layer where the top ME layer and the bottom ME layer are opposite the insulator, and a top electrode coupled to the top ME layer and a bottom electrode coupled to the bottom ME layer. A voltage between the top electrode and the top FM layer is a first input; a voltage between the bottom electrode and the bottom FM layer is a second input; and a resistance between the top FM layer and the bottom FM layer is indicative of either the XOR or the XNOR of the first input and the second input.

In some embodiments, the first boundary magnetism at the interface of the top ME layer and the top FM layer and the second boundary magnetism at the interface of the bottom ME layer and the bottom FM layer are directed in the same direction. The resistance between the top FM layer and the bottom FM layer is indicative of the XNOR of the first input and the second input.

In some embodiments, the first boundary magnetism at the interface of the top ME layer and the top FM layer and the second boundary magnetism at the interface of the bottom ME layer and the bottom FM layer are directed opposite to one another. The resistance between the top FM layer and the bottom FM layer is indicative of the XOR of the first input and the second input.

In some embodiments, a method of configuring a configurable ME MTJ XOR/XNOR gate includes causing a first boundary magnetism at an interface of the top ME layer and the top FM layer and causing a second boundary magnetism at an interface of the bottom ME layer and the bottom FM layer. A voltage between the top electrode and the top FM layer is a first input, a voltage between the bottom electrode and the bottom FM layer is a second input, and a resistance between the top FM layer and the bottom FM layer is indicative of either the XOR or the XNOR of the first input and the second input.

In some embodiments, the method also includes causing the second boundary magnetism to be directed in the same direction as the first boundary magnetism at the interface of the top ME layer and the top FM layer. The resistance between the top FM layer and the bottom FM layer is indicative of the XNOR of the first input and the second input.

In some embodiments, the method also includes causing the second boundary magnetism to be directed opposite to the first boundary magnetism at the interface of the top ME layer and the top FM layer. The resistance between the top FM layer and the bottom FM layer is indicative of the XOR of the first input and the second input.

In some embodiments, a method of operating a configurable ME MTJ XOR/XNOR gate includes causing a first boundary magnetism at an interface of the top ME layer and the top FM layer and causing a second boundary magnetism at an interface of the bottom ME layer and the bottom FM layer. A voltage between the top electrode and the top FM layer is a first input, a voltage between the bottom electrode and the bottom FM layer is a second input, and a resistance between the top FM layer and the bottom FM layer is indicative of a first function chosen from the group consisting of the XOR or the XNOR of the first input and the second input. The method also includes causing at least one of the first boundary magnetism and the second boundary magnetism to be directed in a different direction. The resistance between the top FM layer and the bottom FM layer is indicative of a second function chosen from the group consisting of the XOR or the XNOR of the first input and the second input where the second function is different than the first function.

A ME MTJ XOR gate is provided. The ME MTJ XOR gate includes an insulator separating a top FM layer and a bottom FM layer, a top ME layer on the top FM layer and a bottom ME layer on the bottom FM layer where the top ME layer and the bottom ME layer are opposite the insulator. The ME MTJ XOR gate also includes a top electrode coupled to the top ME layer and a bottom electrode coupled to the bottom ME layer where a voltage between the top electrode and the top FM layer is a first input, a voltage between the bottom electrode and the bottom FM layer is a second input, and a resistance between the top FM layer and the bottom FM layer is indicative of the XOR of the first input and the second input. This ME MTJ XOR has reduced energy consumption and faster switching times compared to similar Complementary Metal-Oxide Semiconductor (CMOS) based devices and is non-volatile, according to some embodiments of the current disclosure.

Also, an ME MTJ full adder is provided. The ME MTJ full adder includes an ME MTJ majority gate which performs a majority function on a first input, a second input, and a carry input and outputs the result to a carry output. The ME MTJ full adder also includes a first ME MTJ XOR gate and a second ME MTJ XOR gate. The first ME MTJ XOR gate performs an XOR function on the first input and the second input and provides a first output. The second ME MTJ XOR gate performs the XOR function on the first output and the carry input and provides a sum output.

This ME MTJ full adder uses less power in operation, requires less surface area, and operates faster than a similar CMOS based full adder, according to some embodiments of the current disclosure.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" or "top" or "bottom" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Figure 1:
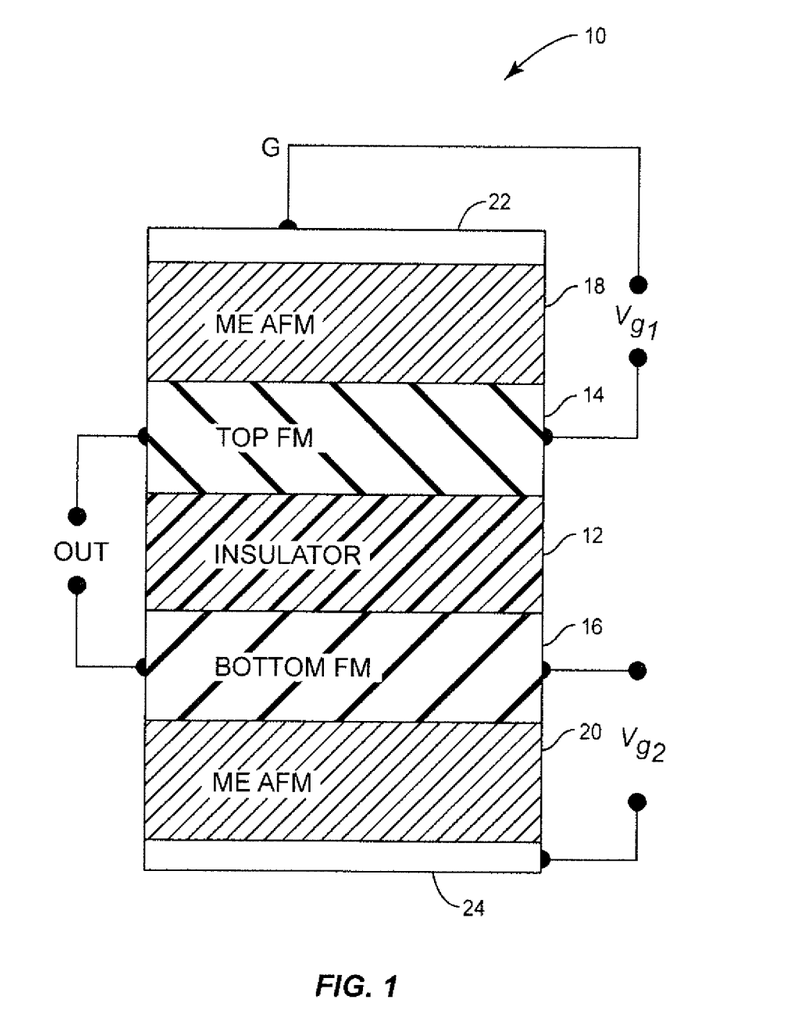
FIG. 1 illustrates a magneto-electric (ME) magnetic tunnel junction (MTJ) Exclusive-OR (XOR) gate, according to some embodiments of the current disclosure.

A magneto-electric (ME) magnetic tunnel junction (MTJ) Exclusive-OR (XOR) gate 10 is shown in FIG. 1, according to some embodiments of the current disclosure. The ME MTJ XOR gate 10 includes an insulator 12 separating a top ferromagnetic (FM) layer 14 and a bottom FM layer 16, a top ME layer 18 on the top FM layer 14 and a bottom ME layer 20 on the bottom FM layer 16 where the top ME layer 18 and the bottom ME layer 20 are opposite the insulator 12. The ME MTJ XOR gate 10 also includes a top electrode 22 coupled to the top ME layer 18 and a bottom electrode 24 coupled to the bottom ME layer 20.

If the insulator 12 is thin enough, electrons can tunnel between the top FM layer 14 and the bottom FM layer 16. Each of the FM layers 14 and 16 has a direction of magnetization. When the directions of magnetization are aligned, or parallel, then the electrons flow more freely across the barrier between the top FM layer 14 and the bottom FM layer 16. When the directions of magnetization are oppositely aligned, or antiparallel, then the electron flow is more restricted. The direction of the two magnetizations can be switched by an external magnetic field.

The top ME layer 18 can create a magnetic field using an applied voltage. Voltage control minimizes power consumption by making use of exchange biasing between the top ME layer 18 and the top FM layer 14. A similar process can also be used for the bottom ME layer 20 and the bottom FM layer 16. In some embodiments, this magnetic field is caused because the applied voltage causes the ME layers to exhibit boundary magnetism. In some embodiments, the ME layers are antiferromagnetic (AFM).

The XOR function is a logical function whose output is TRUE if, and only if, one of its two inputs is TRUE and the other is FALSE. In the case of ME MTJ XOR gate 10, a voltage between the top electrode 22 and the top FM layer 14 is a first input (shown in FIG. 1 as Vg1) and a voltage between the bottom electrode 24 and the bottom FM layer 16 is a second input (shown in FIG. 1 as $V_{g2}$). A resistance between the top FM layer 14 and the bottom FM layer 16 is indicative of the XOR of the first input and the second input (shown in FIG. 1 as OUT). In some embodiments, the logical operation is as follows: If the spin vectors in the top FM layer 14 are oriented parallel to the spin vectors in the bottom FM layer 16, then maximum current can flow across the junction, imposing a FALSE, or bit '0', at the output. Only when the orientation is anti-parallel is the current minimum, thus imposing a TRUE, or bit '1', at the output.

This ME MTJ XOR gate 10 has reduced energy consumption and faster switching times compared to similar Complementary Metal-Oxide Semiconductor (CMOS) based devices and is non-volatile, according to some embodiments of the current disclosure.

Figure 2:
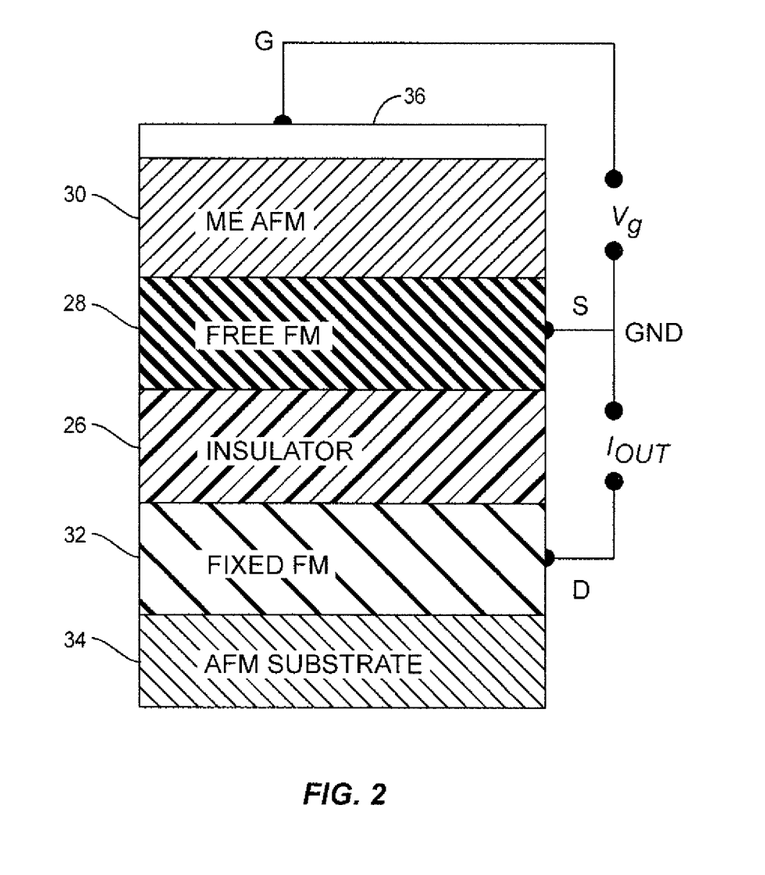
FIG. 2 illustrates an exemplary basic ME MTJ cell.
Figure 3:
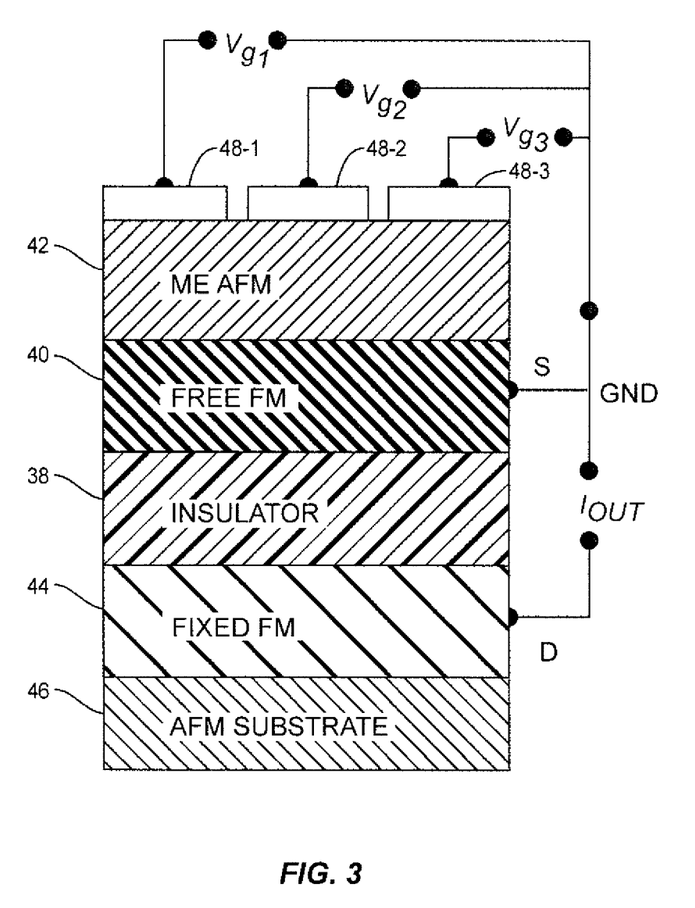
FIG. 3 illustrates an exemplary ME MTJ majority gate.

Other logic gates can also be formed using ME MTJ technology. FIG. 2 illustrates an exemplary basic ME MTJ cell, and FIG. 3 illustrates an exemplary ME MTJ majority gate. Both of these are fundamental gates that can be used to build many more complex circuits.

The basic ME MTJ cell in FIG. 2 includes an insulator 26 which has a free FM layer 28 on one side which is controlled by a ME AFM layer 30. On the other side of the insulator 26, there is a fixed FM layer 32 whose spin vectors are pinned in a specific direction by an AFM substrate layer 34. An input voltage (shown in FIG. 2 as $V_g$) is applied between an electrode 36, which acts like a gate, and the free FM layer 28, which acts like a source. The output of this ME MTJ cell is determined by measuring the resistance between the free FM layer 28 and the fixed FM layer 32, which acts like a drain. Depending on the direction of the spin vectors in the fixed FM layer 32, this basic ME MTJ can operate as either a buffer or an inverter. As a buffer, a logical value of TRUE applied to the voltage $V_g$ would result in a logical TRUE at the $I_{OUT}$. As an inverter, a logical value of TRUE applied to the voltage $V_g$ would result in a logical FALSE at the $I_{OUT}$.

The ME MTJ majority gate of FIG. 3 includes an insulator 38 which has a free FM layer 40 on one side which is controlled by a ME AFM layer 42. On the other side of the insulator 38, there is a fixed FM layer 44 whose spin vectors are pinned in a specific direction by an AFM substrate layer 46. Instead of having one input voltage as in the basic ME MTJ cell in FIG. 2, the ME MTJ majority gate includes three electrodes 48-1, 48-2, and 48-3. Three input voltages (shown in FIG. 3 as $V_{g1}$, $V_{g2}$, and $V_{g3}$) are applied between the electrodes 48-1, 48-2, and 48-3 and the free FM layer 40. The output of this ME MTJ majority gate is determined by measuring the resistance between the free FM layer 40 and the fixed FM layer 44 by measuring $I_{OUT}$. A majority gate outputs TRUE when a majority of the inputs are TRUE. Therefore, with three inputs, the ME MTJ will output TRUE when two or three of the inputs are TRUE. In this embodiment, that switch results from the accumulation of voltage on the ME AFM layer 42. Only one voltage input will not be enough to switch the spin vectors of the free FM layer 40. Two or three voltage inputs will be enough to switch the spins.

Figure 4A:
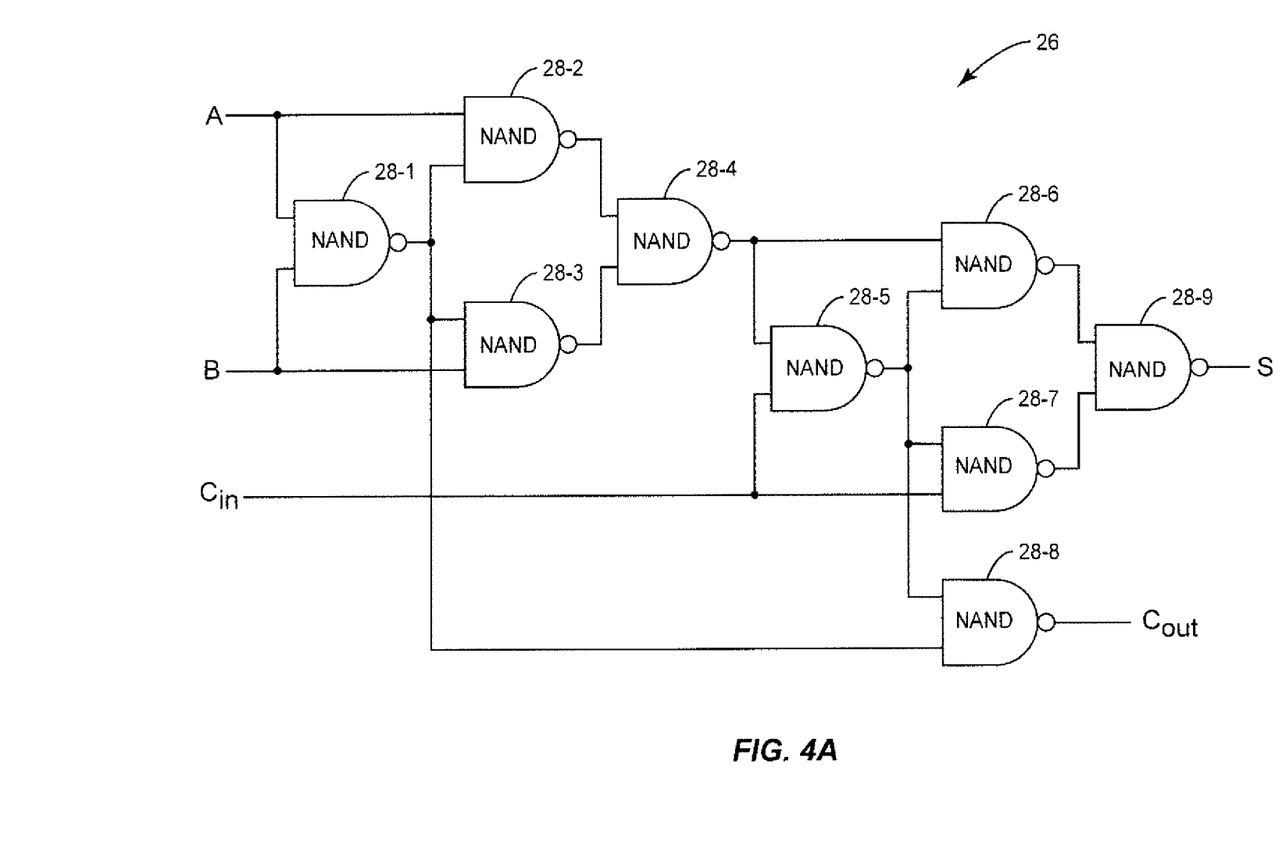
FIG. 4A illustrates a circuit diagram of a full adder implemented with only negative-AND (NAND) gates.

The functionality provided by these ME-MTJ devices constitutes an efficient logic set that compares very favorably with the NAND, NOR, and inverter devices of CMOS logic. By way of illustration, consider the implementation of a full adder in CMOS and its ME-based counterpart. In CMOS, such a circuit requires nine NAND logic gates, with each such gate consisting of four metal oxide semiconductor field-effect transistors (MOSFETs). FIG. 4A illustrates a circuit diagram of a CMOS full adder 50 implemented with only CMOS NAND gates 52-1 through 52-9 (referred to hereafter as CMOS NAND gate 52 or CMOS NAND gates 52). A full adder accepts two inputs (shown in FIG. 4A as A and B) to be added and also an input that corresponds to whether or not a bit was carried in from a previous adder circuit (shown in FIG. 4A as $C_{in}$). The outputs include the resulting bit of the addition known as the sum (shown in FIG. 4A as S) and the carry bit (shown in FIG. 4A as $C_{out}$)

that indicates whether the one-bit addition overflowed and an additional bit needs to be carried to the next computation.

Figure 4B:
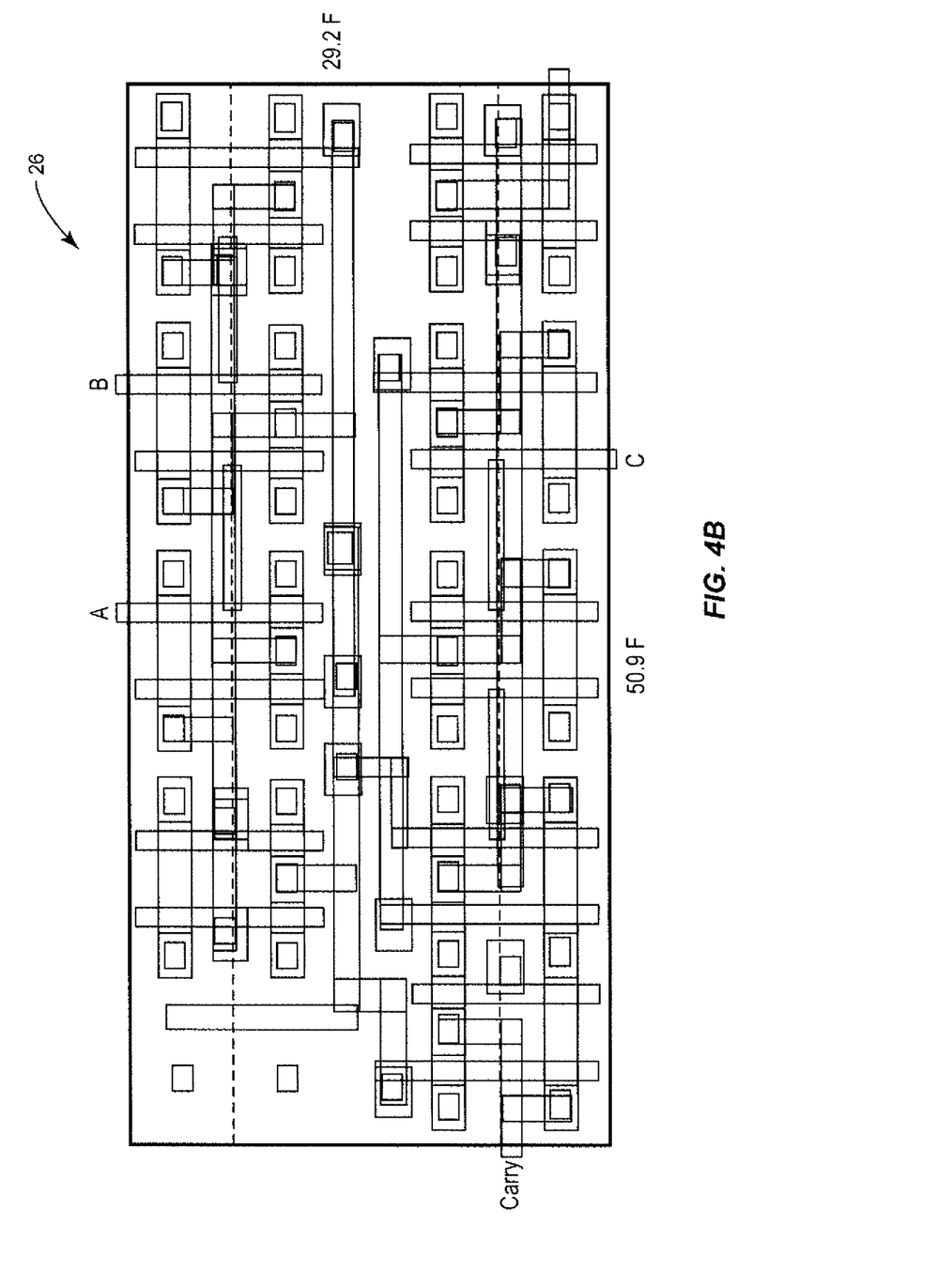
FIG. 4B is a circuit layout diagram for the circuit diagram of FIG. 4A using complementary metal-oxide semiconductor (CMOS) NAND gates.

One possible implementation of the circuit diagram in FIG. 4A is provided in FIG. 4B which is a circuit layout diagram of the CMOS full adder 50 implemented with CMOS NAND gates 52. This may not be the most efficient implementation of a CMOS full adder, but this circuit layout diagram is shown for illustration purposes in order to discuss the size of the circuit. As shown in this layout, the size of this CMOS full adder 50 is 29.2 F by 50.9 F where F is the size of the smallest feature size in the layout. Therefore, this CMOS full adder 50 takes up an area of 1486.28 $F^2$. Also, in the longest path, a signal must travel through six of the NAND gates in the CMOS full adder. Each of these gates imposes an additional time requirement on the circuit since each gate must be given time to transition to the new state before the output can be read.

Figure 5A:
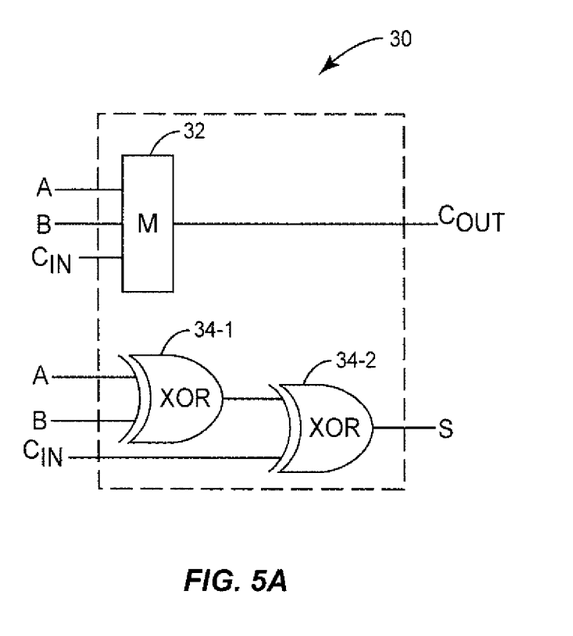
FIG. 5A illustrates a circuit diagram of a full adder implemented with only XOR gates and a majority gate.

Using the ME MTJ logic gates discussed in FIGS. 1 and 3, an ME MTJ full adder can be constructed. FIG. 5A illustrates a circuit diagram of a ME MTJ full adder 54 implemented with only a majority gate 56 and XOR gates 58-1 and 58-2 (referred to hereafter as XOR gate 58 or XOR gates 58). In this ME MTJ full adder 54, the $C_{out}$ signal is the output of a ME MTJ majority gate 56 with A, B, and $C_{in}$ as the three inputs. The resulting bit of the addition (shown in FIG. 5A as S for sum) results from using two ME MTJ XOR gates 58 to XOR the three inputs. In this example, the A and B inputs are XORed first, but other embodiments can XOR a different pair first. Also, it should be noted that the two outputs of the ME MTJ full adder 54 can be computed without using any common components. As such, these two computations could be separated in some embodiments or could be included together with a single set of inputs A, B, and $C_{in}$.

Figure 5B:
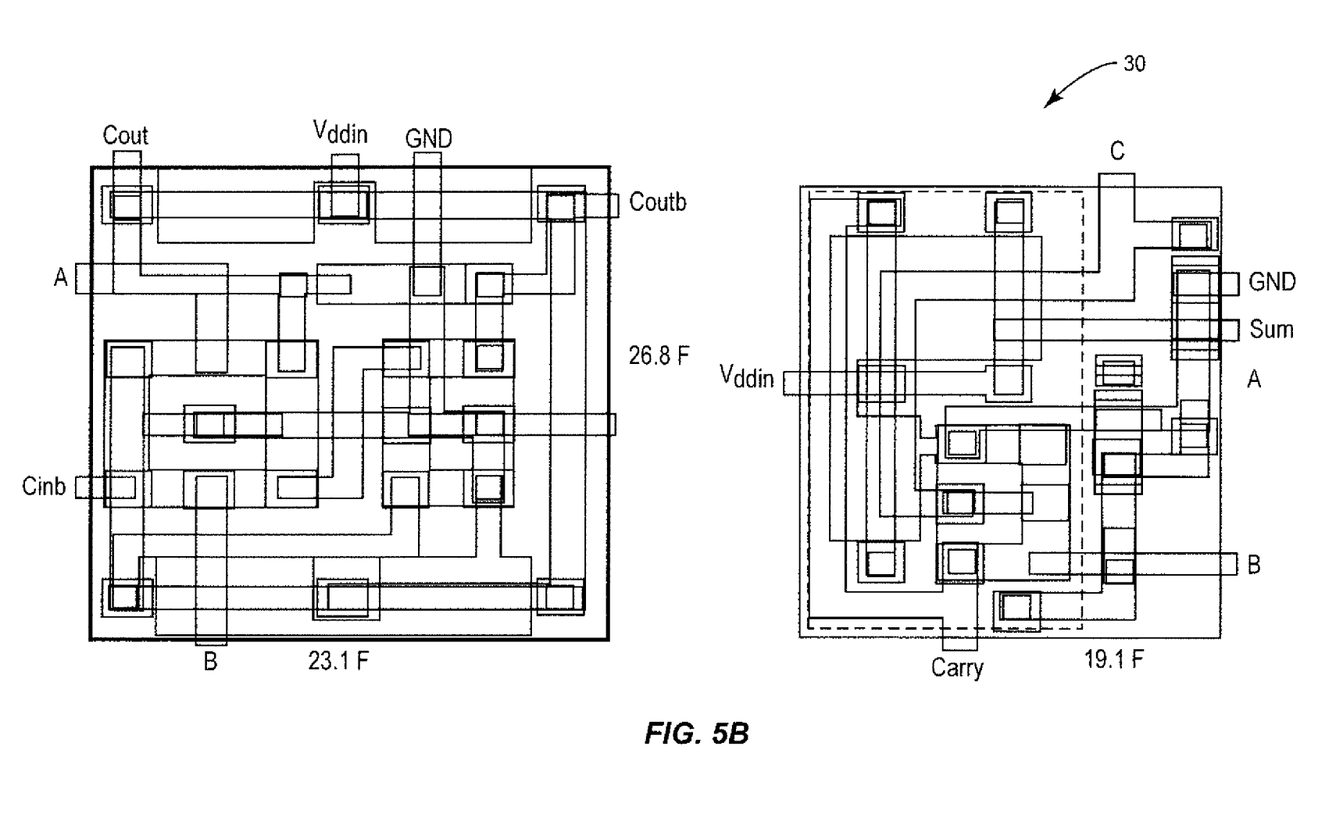
FIG. 5B is a circuit layout diagram for the circuit diagram of FIG. 5A using ME MTJ XOR gates and an ME MTJ majority gate, according to some embodiments of the current disclosure.

One possible implementation of the circuit diagram in FIG. 5A is provided in FIG. 5B, which is a circuit layout diagram for the ME MTJ full adder 54 using ME MTJ XOR gates 58 and an ME MTJ majority gate 56, according to some embodiments of the current disclosure. As in regard to FIG. 4B, this may not be the most efficient implementation of an ME MTJ full adder, but this circuit layout diagram is shown for illustration purposes in order to discuss the size of the circuit. As shown in FIG. 5B, the ME MTJ full adder 54 circuit takes up an area of 511.88 $F^2$. This is nearly a 66% reduction in area required for the ME MTJ full adder 54 as compared to the CMOS full adder 50 implementation shown in FIG. 4B. Also, the maximum distance for a signal to travel in the circuit diagram of FIG. 5A is through the two XOR gates 58. Since these ME MTJ XOR gates 58 are each a single operation, this ME MTJ full adder 54 is potentially much faster to compute the result than a CMOS based full adder. Additionally, the CMOS full adder is completely volatile, meaning that if the bias voltages are removed from the transistors involved, all state information is lost. Since the magnetization of the various components of the ME MTJ logic gates still exists even without any voltage, the ME MTJ circuits are non-volatile; they will retain their states even with the power off. The non-volatility of ME-MTJ based technology could permit instant recovery from a power loss condition. The reduction in path length has the effect of reducing the expected circuit delay. With reduced cell area, interconnect length is also reduced, which has a beneficial effect on capacitance, reducing delay time and power losses. There is also a reduction of output load on the carry to two gates compared to three in the NAND option, further reducing switching power.

As discussed above, the top ME layer 18 of the ME MTJ XOR gate 10 can create a magnetic field using an applied voltage. Voltage control minimizes power consumption by making use of exchange biasing between the top ME layer 18 and the top FM layer 14. A similar process can also be used for the bottom ME layer 20 and the bottom FM layer 16. In some embodiments, this magnetic field is caused because the applied voltage causes the ME layers to exhibit boundary magnetism. In some embodiments, this boundary magnetism can be either replaced or supplemented by an additional magnetic field. These additional fields are referred to as a first boundary magnetism and a second boundary magnetism. In some embodiments, one or both of these values may be changed to change the operation of the gate.

Figure 6:
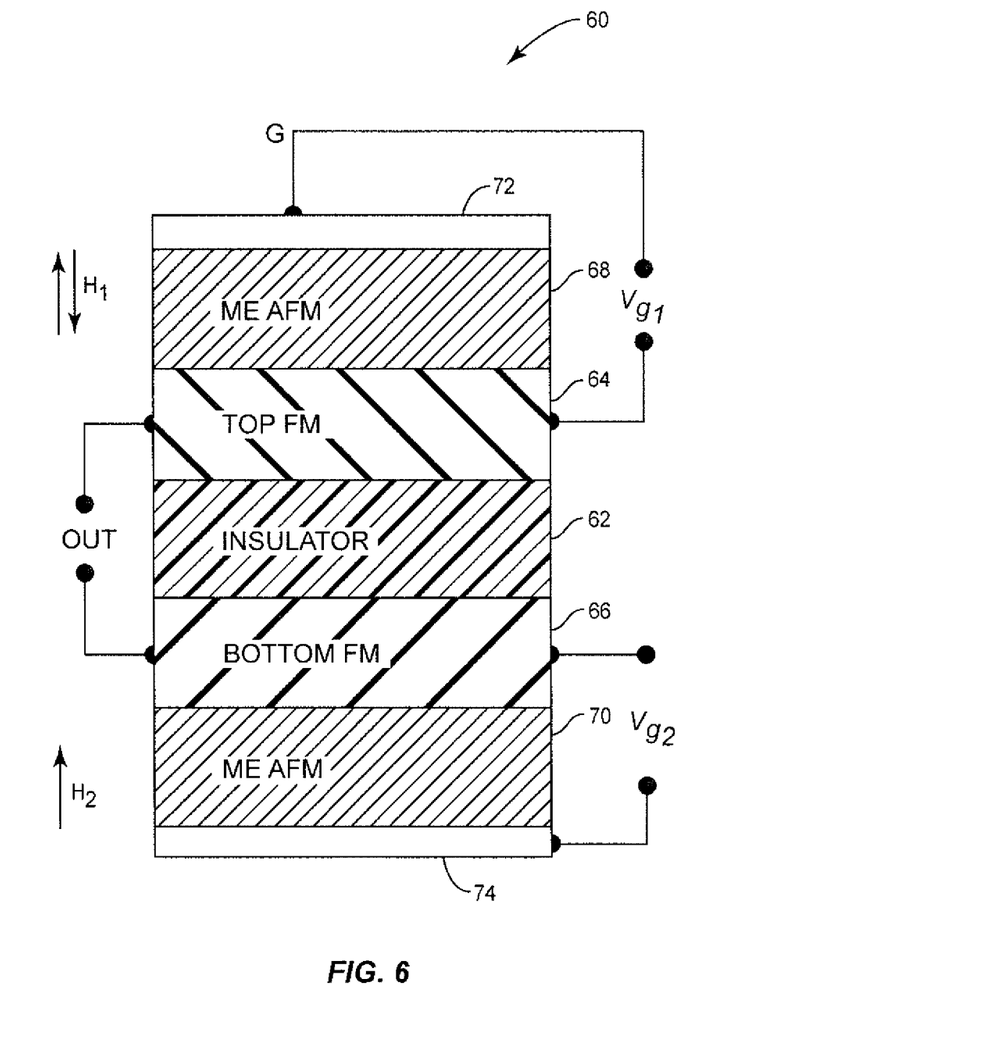
FIG. 6 illustrates a configurable ME MTJ XOR/Exclusive-NOR (XNOR) gate, according to some embodiments of the current disclosure.

FIG. 6 illustrates a configurable ME MTJ XOR/ Exclusive-NOR (XNOR) gate 60, according to some embodiments of the current disclosure. The configurable ME MTJ XOR/XNOR gate 60 includes an insulator 62 separating a top FM layer 64 and a bottom FM layer 66, a top ME layer 68 on the top FM layer 64 and a bottom ME layer 70 on the bottom FM layer 66 where the top ME layer 68 and the bottom ME layer 70 are opposite the insulator 62. The configurable ME MTJ XOR/XNOR gate 60 also includes a top electrode 72 coupled to the top ME layer 68 and a bottom electrode 74 coupled to the bottom ME layer 70.

Similar to the ME MTJ XOR gate 10 discussed above, if the insulator 62 is thin enough, electrons can tunnel between the top FM layer 64 and the bottom FM layer 66. Each of the FM layers 64 and 66 has a direction of magnetization. When the directions of magnetization are aligned, or parallel, then the electrons flow more freely across the barrier between the top FM layer 64 and the bottom FM layer 66. When the directions of magnetization are oppositely aligned, or antiparallel, then the electron flow is more restricted. The direction of the two magnetizations can be switched by an external magnetic field.

FIG. 6 also illustrates a first boundary magnetism ($H_1$) at an interface of the top ME layer 68 and the top FM layer 64 and a second boundary magnetism ($H_2$) at an interface of the bottom ME layer 70 and the bottom FM layer 66. Depending upon the relative direction of these fields ($H_1$ and $H_2$), the configurable ME MTJ XOR/XNOR gate 60 may be configured to exhibit either XOR or XNOR functionality. This is described in more detail in relation to FIGS. 7 and 8.

Realization of different magnetic fields ($H_1$ and $H_2$) in the top FM layer 64 and the bottom FM layer 66 is feasible via a number of different approaches. In some embodiments, one or more of the fields may be caused using nanostructured magnets with different geometries and/or different materials (coercive properties) as the top electrode 72 and the bottom electrode 74. In some embodiments, one or more of the fields may be caused by making use of cross-wire arrays, as in ferrite-core and MTJ memories. In some embodiments, one or more of the fields may be caused by using switching of magnetism in the top electrode 72 or the bottom electrode 74 via mechanisms such as Spin-Transfer Torque (STT). Any of these embodiments may be combined with each other or be combined with the use of Earth's magnetic field as a means to generate the two separate bias magnetic fields.

Figure 7:
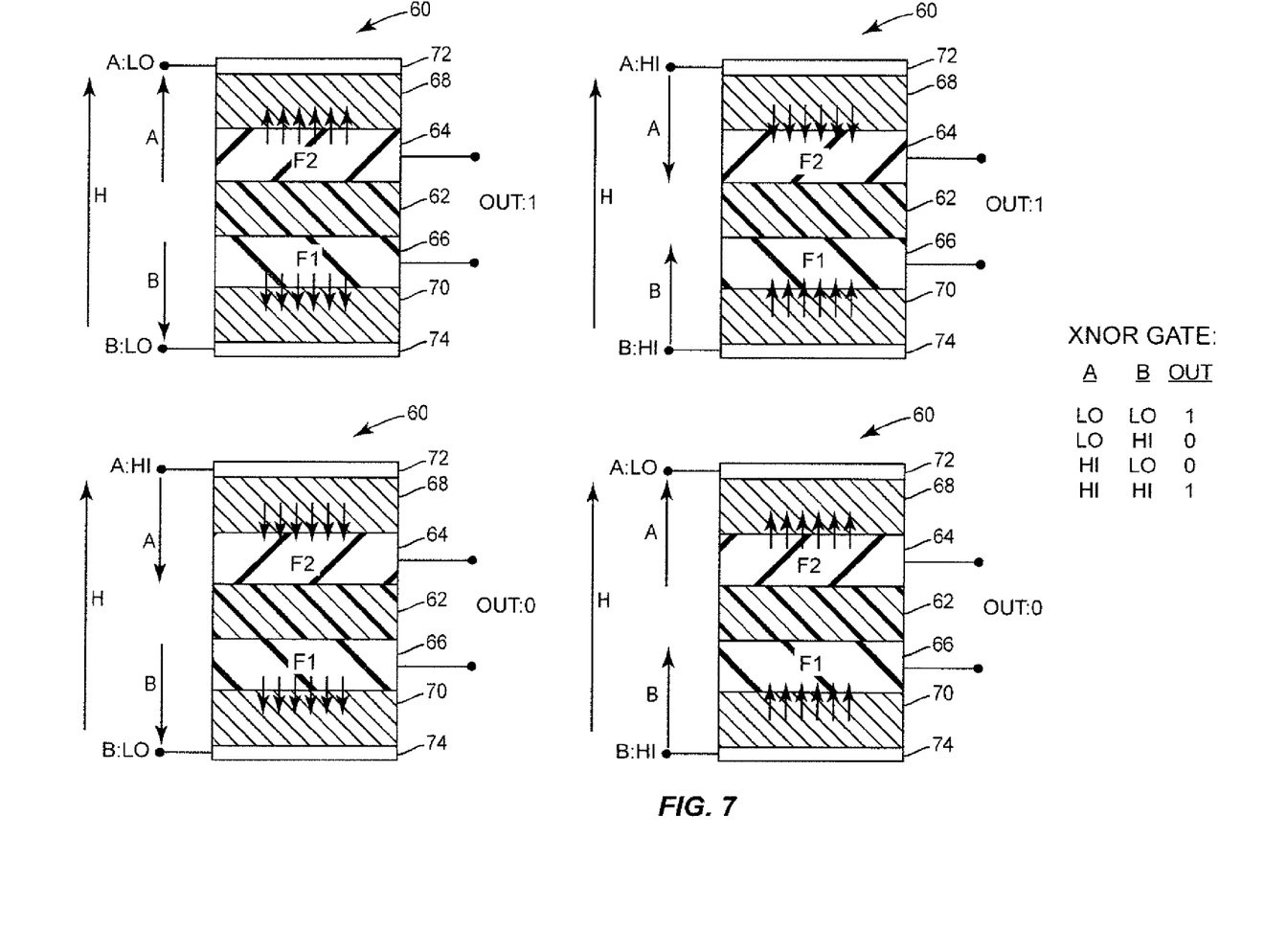
FIG. 7 illustrates the configurable ME MTJ XOR/XNOR gate of FIG. 6 configured to operate as a XNOR gate, according to some embodiments of the current disclosure.
Figure 8:
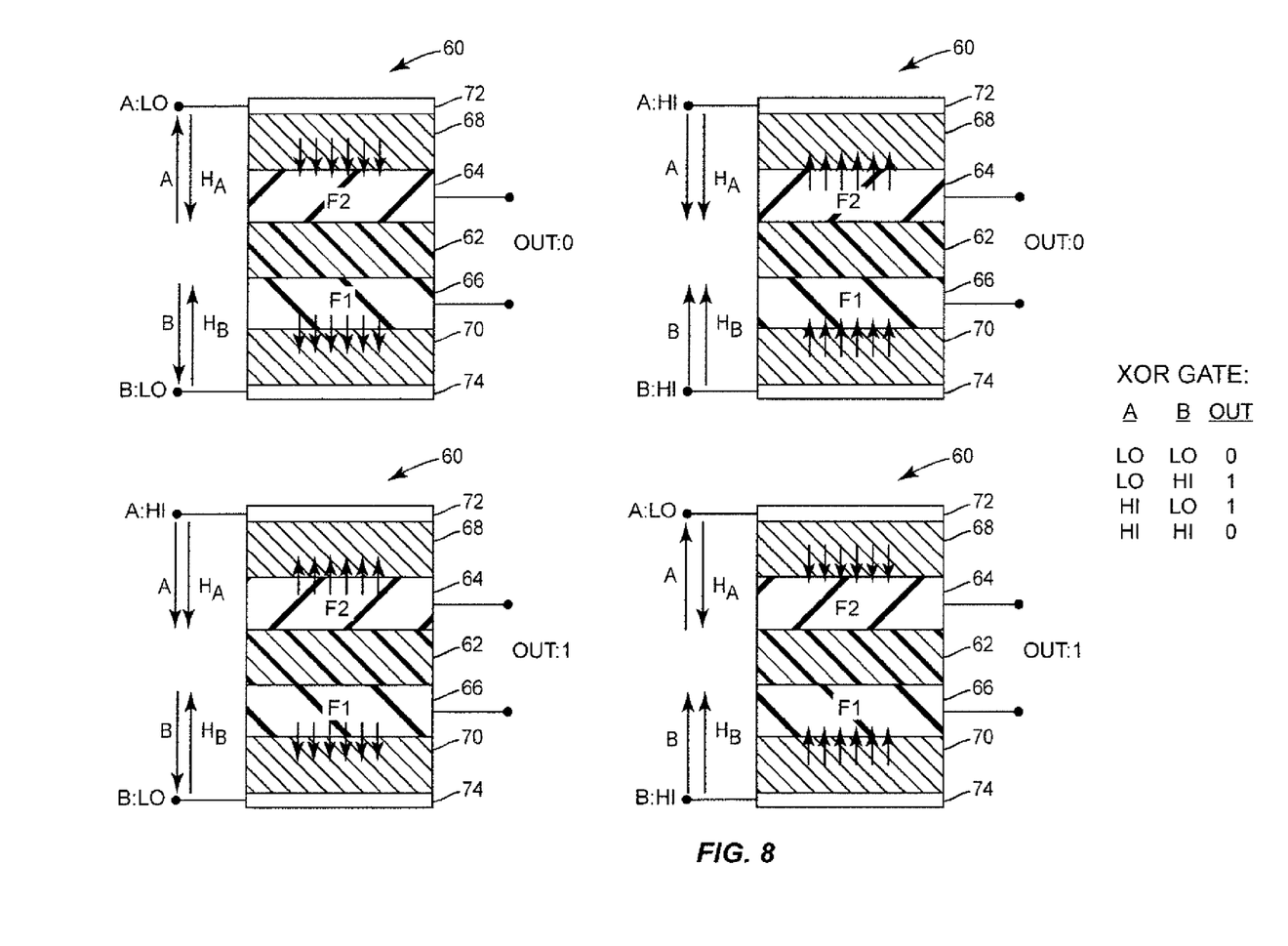
FIG. 8 illustrates the configurable ME MTJ XOR/XNOR gate of FIG. 6 configured to operate as a XOR gate, according to some embodiments of the current disclosure.

In the discussion of FIGS. 7 and 8, it is assumed that when the tunnel resistance between the top FM layer 64 and the bottom FM layer 66 is low, the output is correspondingly defined as LO, "0," or logical FALSE. This state occurs when the overall directions of magnetization are aligned, or parallel, since the electrons flow more freely across the barrier from one FM to the other. Correspondingly, when the tunnel resistance between the top FM layer 64 and the bottom FM layer 66 is high, the output is correspondingly defined as HI, "1," or logical TRUE. This state occurs when the overall directions of magnetization are oppositely aligned, or antiparallel, since the electron flow is more restricted. However, these definitions are only examples of how to map the resistance between the top FM layer 64 and the bottom FM layer 66. Depending on the mapping, the resistance may be either the XOR or the XNOR of the first input and the second input.

FIG. 7 illustrates the configurable ME MTJ XOR/XNOR gate 60 of FIG. 6 configured to operate as a XNOR gate, according to some embodiments of the current disclosure. The XNOR function is achieved in a geometry in which the magnetic fields in the top FM layer 64 and the bottom FM layer 66 ($H_1$ and $H_2$) are in the same direction. In some embodiments, these magnetic fields may be the same magnetic field and are shown in FIG. 7 as H for simplicity. The first input (voltage between the top electrode 72 and the top FM layer 64) is shown as A and the second input (voltage between the bottom electrode 74 and the bottom FM layer 66) is shown as B.

Using the conventions for the tunnel resistance between the top FM layer 64 and the bottom FM layer 66 discussed above, the four different logical states are shown with corresponding inputs and outputs.

For the ME MTJ XOR gate 10 described above, it could be assumed that this is the arrangement, especially if no magnetic field is present except the Earth's magnetic field. In that case, the resistance between the top FM layer 14 and the bottom FM layer 16 is indicative of the XOR of the first input and the second input by being the inverse of the values. On the other hand, if the convention for the tunnel resistance discussed above is switched, then the output of the ME MTJ XOR gate 10 is the XOR of the first input and the second input directly.

FIG. 8 illustrates the configurable ME MTJ XOR/XNOR gate 60 of FIG. 6 configured to operate as a XOR gate, according to some embodiments of the current disclosure. The XOR function is achieved in a geometry in which the magnetic fields in the top FM layer 64 and the bottom FM layer 66 ($H_1$ and $H_2$) are in the opposite direction. These magnetic fields are shown in FIG. 8 as $H_A$ and $H_B$ to match the input voltages. As before, the first input (voltage between the top electrode 72 and the top FM layer 64) is shown as A and the second input (voltage between the bottom electrode 74 and the bottom FM layer 66) is shown as B.

Using the conventions for the tunnel resistance between the top FM layer 64 and the bottom FM layer 66 discussed above, the four different logical states are shown with corresponding inputs and outputs.

For the ME MTJ XOR gate 10 described above, it could also be assumed that this is the arrangement and the resistance between the top FM layer 14 and the bottom FM layer 16 is the XOR of the first input and the second input directly. On the other hand, if the convention for the tunnel resistance discussed above is switched, then the output of the ME MTJ XOR gate 10 is indicative of the XOR of the first input and the second input by being the inverse of the values.

In some embodiments, both of the magnetisms can be changed while in other embodiments only one is changeable while the other remains fixed. In In this way, the functionality of the configurable ME MTJ XOR/XNOR gate 60 is configurable. This may be configured during production or may even be configurable during operation of the configurable ME MTJ XOR/XNOR gate 60.

Those skilled in the art will recognize improvements and modifications to the preferred embodiments of the present disclosure. All such improvements and modifications are considered within the scope of the concepts disclosed herein and the claims that follow.

What is claimed is:

1. A configurable magneto-electric (ME) magnetic tunnel junction (MTJ) Exclusive-OR (XOR)/Exclusive-NOR (XNOR) gate comprising:
   an insulator separating a top ferromagnetic (FM) layer and a bottom FM layer;
   a top ME layer on the top FM layer with a first boundary magnetism at an interface of the top ME layer and the top FM layer;
   a bottom ME layer on the bottom FM layer with a second boundary magnetism at an interface of the bottom ME layer and the bottom FM layer where the top ME layer and the bottom ME layer are opposite the insulator; and
   a top electrode coupled to the top ME layer and a bottom electrode coupled to the bottom ME layer;
   wherein a voltage between the top electrode and the top FM layer is a first input; a voltage between the bottom electrode and the bottom FM layer is a second input; and a resistance between the top FM layer and the bottom FM layer is indicative of either the XOR or the XNOR of the first input and the second input.

2. The configurable ME MTJ XOR/XNOR gate of claim 1 wherein:
   the first boundary magnetism at the interface of the top ME layer and the top FM layer and the second boundary magnetism at the interface of the bottom ME layer and the bottom FM layer are directed in the same direction; and
   the resistance between the top FM layer and the bottom FM layer is indicative of the XNOR of the first input and the second input.

3. The configurable ME MTJ XOR/XNOR gate of claim 1 wherein:
   the first boundary magnetism at the interface of the top ME layer and the top FM layer and the second boundary magnetism at the interface of the bottom ME layer and the bottom FM layer are directed opposite to one another; and
   the resistance between the top FM layer and the bottom FM layer is indicative of the XOR of the first input and the second input.

4. The configurable ME MTJ XOR/XNOR gate of claim 1 wherein at least one of the first boundary magnetism and the second boundary magnetism is generated by a nanostructured magnet.

5. The configurable ME MTJ XOR/XNOR gate of claim 1 wherein at least one of the first boundary magnetism and the second boundary magnetism is generated by a cross-wire array.

6. The configurable ME MTJ XOR/XNOR gate of claim 1 wherein at least one of the first boundary magnetism and the second boundary magnetism is generated by a spin-transfer torque.

7. The configurable ME MTJ XOR/XNOR gate of claim 1 wherein the top ME layer and the bottom ME layer are antiferromagnetic (AFM).

8. The configurable ME MTJ XOR/XNOR gate of claim 1 wherein a voltage applied to the top ME layer through the top electrode causes the top ME layer to exhibit boundary magnetism, and a voltage applied to the bottom ME layer through the bottom electrode causes the bottom ME layer to exhibit boundary magnetism.

9. The configurable ME MTJ XOR/XNOR gate of claim 1 wherein a relatively high resistance between the top FM layer and the bottom FM layer indicates a logical TRUE and a relatively low resistance between the top FM layer and the bottom FM layer indicates a logical FALSE.

10. The configurable ME MTJ XOR/XNOR gate of claim 1 wherein:
when the voltage between the top electrode and the top FM layer is similar to the voltage between the bottom electrode and the bottom FM layer, then spin vectors in the top FM layer will be aligned parallel to spin vectors in the bottom FM layer; and
when the voltage between the top electrode and the top FM layer is dissimilar to the voltage between the bottom electrode and the bottom FM layer, then spin vectors in the top FM layer will be aligned antiparallel to spin vectors in the bottom FM layer.

11. The configurable ME MTJ XOR/XNOR gate of claim 1 wherein a required surface area for forming the ME MTJ XOR gate is less than a required surface area for forming a Complementary Metal-Oxide Semiconductor (CMOS) XOR gate.

12. The configurable ME MTJ XOR/XNOR gate of claim 1 wherein an amount of time to operate the ME MTJ XOR gate is less than an amount of time to operate a Complementary Metal-Oxide Semiconductor (CMOS) XOR gate.

13. The configurable ME MTJ XOR/XNOR gate of claim 1 wherein at least one of the top ME layer and the bottom ME layer is chosen from the group consisting of $Cr_2O_3$ and $Fe_2TeO_6$.

14. The configurable ME MTJ XOR/XNOR gate of claim 13 wherein both of the top ME layer and the bottom ME layer are $Cr_2O_3$.

15. The configurable ME MTJ XOR/XNOR gate of claim 1 wherein the insulator is crystalline MgO.

16. The configurable ME MTJ XOR/XNOR gate of claim 1 wherein the insulator is less than 10 nanometers thick.

17. A method of configuring a configurable magneto-electric (ME) magnetic tunnel junction (MTJ) Exclusive-OR (XOR)/Exclusive-NOR (XNOR) gate comprising an insulator separating a top ferromagnetic (FM) layer and a bottom FM layer; a top ME layer on the top FM layer; a bottom ME layer on the bottom FM layer where the top ME layer and the bottom ME layer are opposite the insulator; and a top electrode coupled to the top ME layer and a bottom electrode coupled to the bottom ME layer, the method comprising:
causing a first boundary magnetism at an interface of the top ME layer and the top FM layer; and
causing a second boundary magnetism at an interface of the bottom ME layer and the bottom FM layer;
wherein a voltage between the top electrode and the top FM layer is a first input; a voltage between the bottom electrode and the bottom FM layer is a second input; and a resistance between the top FM layer and the bottom FM layer is indicative of either the XOR or the XNOR of the first input and the second input.

18. The method of claim 17 wherein:
causing the second boundary magnetism at the interface of the bottom ME layer and the bottom FM layer comprises causing the second boundary magnetism to be directed in the same direction as the first boundary magnetism at the interface of the top ME layer and the top FM layer; and
the resistance between the top FM layer and the bottom FM layer is indicative of the XNOR of the first input and the second input.

19. The method of claim 17 wherein:
causing the second boundary magnetism at the interface of the bottom ME layer and the bottom FM layer comprises causing the second boundary magnetism to be directed opposite to the first boundary magnetism at the interface of the top ME layer and the top FM layer; and
the resistance between the top FM layer and the bottom FM layer is indicative of the XOR of the first input and the second input.

20. A method of operating a configurable magneto-electric (ME) magnetic tunnel junction (MTJ) Exclusive-OR (XOR)/Exclusive-NOR (XNOR) gate comprising an insulator separating a top ferromagnetic (FM) layer and a bottom FM layer; a top ME layer on the top FM layer; a bottom ME layer on the bottom FM layer where the top ME layer and the bottom ME layer are opposite the insulator; and a top electrode coupled to the top ME layer and a bottom electrode coupled to the bottom ME layer, the method comprising:
causing a first boundary magnetism at an interface of the top ME layer and the top FM layer;
causing a second boundary magnetism at an interface of the bottom ME layer and the bottom FM layer;
wherein a voltage between the top electrode and the top FM layer is a first input; a voltage between the bottom electrode and the bottom FM layer is a second input; and a resistance between the top FM layer and the bottom FM layer is indicative of a first function chosen from the group consisting of the XOR or the XNOR of the first input and the second input; and
causing at least one of the first boundary magnetism and the second boundary magnetism to be directed in a different direction;
wherein the resistance between the top FM layer and the bottom FM layer is indicative of a second function chosen from the group consisting of the XOR or the XNOR of the first input and the second input where the second function is different than the first function.

* * * * *